(12) United States Patent
Quimby et al.

(10) Patent No.: US 9,009,981 B2
(45) Date of Patent: Apr. 21, 2015

(54) UTILITY KNIFE BLADES HAVING MULTIPLE CUTTING PORTIONS AND SECURING CONNECTIONS

(71) Applicants: Elwood Dean Quimby, Derby, KS (US); Hubert J. Bung, Wichita, KS (US)

(72) Inventors: Elwood Dean Quimby, Derby, KS (US); Hubert J. Bung, Wichita, KS (US)

( * ) Notice: Subject to any disclaimer, the term of this patent is extended or adjusted under 35 U.S.C. 154(b) by 0 days.

(21) Appl. No.: 14/196,637

(22) Filed: Mar. 4, 2014

(65) Prior Publication Data

US 2014/0182144 A1  Jul. 3, 2014

Related U.S. Application Data

(63) Continuation-in-part of application No. 14/018,113, filed on Sep. 4, 2013, now Pat. No. 8,978,257, which is a continuation-in-part of application No. 13/199,206, filed on Aug. 23, 2011, now abandoned.

(60) Provisional application No. 61/743,426, filed on Sep. 4, 2012, provisional application No. 61/402,536, filed on Sep. 1, 2010.

(51) Int. Cl.
| | |
|---|---|
| *B26B 9/00* | (2006.01) |
| *B26B 9/02* | (2006.01) |
| *G03F 1/00* | (2012.01) |
| *G06F 17/50* | (2006.01) |

(52) U.S. Cl.
CPC ... *B26B 9/00* (2013.01); *B26B 9/02* (2013.01); *G03F 1/00* (2013.01); *G06F 17/5068* (2013.01); *G06F 17/5072* (2013.01)

(58) Field of Classification Search
CPC ............ B26B 9/00; B26B 9/02; B26B 21/54; B26B 21/56
USPC ............ 30/346.55, 346.57, 346.61, 351, 353, 30/357; D8/20
See application file for complete search history.

(56) References Cited

U.S. PATENT DOCUMENTS

| | | | |
|---|---|---|---|
| 59,770 A | | 11/1866 | Jann |
| 394,349 A | * | 12/1888 | Elliott ............................. 30/353 |
| 639,850 A | | 12/1899 | Hahn |
| 670,120 A | | 3/1901 | Van Tuyl |
| 978,165 A | | 12/1910 | Johnson |
| D47,697 S | | 8/1915 | Korpa |

(Continued)

FOREIGN PATENT DOCUMENTS

| | | | |
|---|---|---|---|
| EP | 535563 A1 | * | 4/1993 |
| FR | 2571486 | | 4/1986 |

(Continued)

*Primary Examiner* — Jason Daniel Prone
(74) *Attorney, Agent, or Firm* — Law Office of Mark Brown, LLC; Christopher M. DeBacker; Mark E. Brown

(57) ABSTRACT

A three-sided disposable cutting blade for use within a utility knife. The cutting blade features between three and six distinct cutting portions. The cutting blade may be rotated and flipped such that each cutting portion may be presented from the utility knife as the active cutting portion. Features of the cutting blade include a wear-coat indicator which is located at or near each cutting portion and indicates when a portion has been used; grippable locations on the body of the blade to increase the grippibility of the blade when removing and handling the blade; multiple mounting-hole orientations; and mass-reducing punch-outs which reduce cutting friction of the blade against the object being cut.

16 Claims, 18 Drawing Sheets

(56) References Cited

U.S. PATENT DOCUMENTS

| | | | |
|---|---|---|---|
| D47,778 S | 8/1915 | Yapczenski | |
| 1,176,257 A | 3/1916 | Velcansky | |
| 1,278,682 A | 9/1918 | Kohnz | |
| 1,600,126 A * | 9/1926 | Myatt | 30/346.61 |
| 1,739,214 A | 12/1929 | Darling | |
| 1,814,528 A | 7/1931 | Purcell | |
| 1,829,499 A | 10/1931 | Boos | |
| 1,850,090 A | 3/1932 | Alexander et al. | |
| 1,872,721 A | 8/1932 | Ford | |
| 1,903,789 A | 4/1933 | Michaels | |
| 1,940,107 A | 12/1933 | Stichler | |
| 2,003,761 A * | 6/1935 | Testi | 30/346.61 |
| 2,036,057 A * | 3/1936 | Kulisek | 30/346.57 |
| 2,041,778 A * | 5/1936 | Peters | 30/346.57 |
| 2,070,190 A | 2/1937 | Wells | |
| 2,126,080 A * | 8/1938 | Backer | 30/353 |
| 2,248,796 A | 7/1941 | Vosbikian et al. | |
| 2,324,555 A | 7/1943 | Blunk | |
| 2,365,301 A * | 12/1944 | Shortell | 83/835 |
| 2,382,440 A | 8/1945 | Peterson | |
| 2,443,873 A | 6/1948 | Simpson | |
| 2,520,463 A | 8/1950 | Hubner | |
| 2,542,582 A | 2/1951 | Schwork | |
| 2,551,899 A | 5/1951 | Pfeifer et al. | |
| 2,557,539 A | 6/1951 | Dawson | |
| 2,587,336 A | 2/1952 | Larson | |
| 2,631,372 A | 3/1953 | Fournier | |
| 2,650,442 A | 9/1953 | Soltow et al. | |
| 2,662,287 A | 12/1953 | Ferguson | |
| 2,681,506 A | 6/1954 | Tipple | |
| 2,732,620 A | 1/1956 | Gibbs | |
| 2,835,031 A | 5/1958 | Cook et al. | |
| 2,863,213 A | 12/1958 | Rypysc | |
| 2,962,816 A | 12/1960 | Glotzer | |
| 3,037,342 A | 6/1962 | Boyer | |
| 3,045,348 A | 7/1962 | Dungan | |
| 3,448,518 A | 6/1969 | Sklar | |
| 3,518,758 A | 7/1970 | Bennet | |
| 3,600,729 A | 8/1971 | Laughlin et al. | |
| 3,641,667 A | 2/1972 | Leopoldi | |
| 3,872,591 A | 3/1975 | Quenot | |
| 4,027,389 A | 6/1977 | Atchisson | |
| 4,077,124 A | 3/1978 | Christmann | |
| 4,288,921 A | 9/1981 | Rhynes | |
| 4,502,219 A | 3/1985 | Hibben | |
| 4,504,091 A | 3/1985 | Ohshiro | |
| 4,534,110 A | 8/1985 | Glass | |
| 4,592,113 A | 6/1986 | Selfors | |
| 4,606,125 A | 8/1986 | Jensen | |
| 4,730,394 A | 3/1988 | Sonner | |
| 4,745,653 A | 5/1988 | Bliznak | |
| 4,787,146 A * | 11/1988 | Gaskins | 30/357 |
| 4,807,362 A | 2/1989 | Prentice | |
| 4,856,385 A | 8/1989 | Ogilvie et al. | |
| 4,886,009 A * | 12/1989 | Gondar et al. | 30/289 |
| 5,003,696 A | 4/1991 | Spehar | |
| 5,081,770 A * | 1/1992 | Fierthaler | 30/351 |
| 5,103,564 A | 4/1992 | MacDonald | |
| 5,303,474 A | 4/1994 | Keklak et al. | |
| 5,303,574 A * | 4/1994 | Matossian et al. | 83/522.27 |
| 5,349,753 A | 9/1994 | Gaffney | |
| 5,400,512 A | 3/1995 | Brush | |
| 5,440,811 A * | 8/1995 | Challis | 30/353 |
| 5,446,965 A | 9/1995 | Makridis | |
| 5,557,852 A | 9/1996 | Frisina | |
| 5,636,845 A | 6/1997 | Newham | |
| 5,720,105 A * | 2/1998 | Gates | 30/353 |
| 5,769,094 A | 6/1998 | Jenkins, Jr. et al. | |
| D400,412 S * | 11/1998 | Gold | D8/20 |
| 5,960,545 A | 10/1999 | Sheperd et al. | |
| 6,134,788 A | 10/2000 | Chen et al. | |
| 6,163,965 A | 12/2000 | Lung | |
| 6,192,589 B1 | 2/2001 | Martone et al. | |
| 6,243,952 B1 | 6/2001 | Holcomb et al. | |
| 6,314,646 B1 | 11/2001 | Schmidt | |
| 6,321,454 B1 | 11/2001 | Wass | |
| D462,250 S | 9/2002 | Ping | |
| 6,446,341 B1 | 9/2002 | Wang et al. | |
| 6,454,427 B1 | 9/2002 | Chen | |
| 6,460,254 B1 | 10/2002 | Mori et al. | |
| 6,497,045 B1 | 12/2002 | Forgami | |
| 6,711,824 B2 | 3/2004 | Hruska | |
| 6,796,033 B2 | 9/2004 | Owoc | |
| 6,823,593 B2 * | 11/2004 | Dunn-Rankin | 30/346.56 |
| 6,848,185 B2 | 2/2005 | Tebo | |
| 6,887,250 B1 | 5/2005 | Dority et al. | |
| 6,895,674 B2 * | 5/2005 | Ai | 30/353 |
| D510,009 S | 9/2005 | Lee | |
| 6,968,622 B2 | 11/2005 | Ping | |
| 6,976,311 B2 | 12/2005 | Lee | |
| 7,093,367 B1 | 8/2006 | Huang | |
| 7,255,705 B2 | 8/2007 | Hsu et al. | |
| 7,380,341 B2 | 6/2008 | Ping | |
| D580,241 S * | 11/2008 | Fraga et al. | D8/20 |
| 7,480,997 B2 | 1/2009 | Ping | |
| 7,552,537 B2 | 6/2009 | Ye | |
| D602,752 S * | 10/2009 | Luciano et al. | D8/20 |
| D617,161 S * | 6/2010 | Tom et al. | D8/20 |
| D617,162 S * | 6/2010 | Tom et al. | D8/20 |
| D619,865 S * | 7/2010 | Boehler | D8/20 |
| 7,797,835 B2 | 9/2010 | Zeng | |
| 7,921,568 B2 * | 4/2011 | Green | 30/346.55 |
| 8,006,391 B1 | 8/2011 | Mashburn et al. | |
| 8,056,241 B2 | 11/2011 | David et al. | |
| 8,074,362 B2 | 12/2011 | Gui et al. | |
| D686,481 S | 7/2013 | Robinson et al. | |
| 8,549,754 B2 * | 10/2013 | Bung et al. | 30/161 |
| 8,567,069 B2 | 10/2013 | Robinson et al. | |
| 8,739,412 B2 * | 6/2014 | Gioia | 30/346.61 |
| 8,776,380 B1 * | 7/2014 | Quimby et al. | 30/155 |
| 2003/0177645 A1 * | 9/2003 | Flury et al. | 30/355 |
| 2003/0200853 A1 * | 10/2003 | Gongola | 83/522.15 |
| 2004/0055165 A1 | 3/2004 | Chan | |
| 2004/0103541 A1 | 6/2004 | Scarla | |
| 2004/0231169 A1 | 11/2004 | Roberson | |
| 2006/0272157 A1 | 12/2006 | Zeng | |
| 2008/0264227 A1 * | 10/2008 | Sudmalis et al. | 83/614 |
| 2009/0165309 A1 | 7/2009 | Kamb et al. | |
| 2009/0211421 A1 * | 8/2009 | Lier et al. | 83/522.27 |
| 2010/0175267 A1 | 7/2010 | Seber et al. | |
| 2010/0299935 A1 | 12/2010 | Ping | |
| 2011/0167647 A1 | 7/2011 | Gringer et al. | |
| 2012/0055029 A1 | 3/2012 | Gui et al. | |
| 2012/0079722 A1 * | 4/2012 | Quimby et al. | 30/353 |
| 2012/0240413 A1 | 9/2012 | Quimby et al. | |
| 2013/0047447 A1 * | 2/2013 | Fossella | 30/351 |
| 2013/0185943 A1 | 7/2013 | Landwehr | |
| 2013/0333230 A1 * | 12/2013 | Quimby et al. | 30/321 |
| 2014/0068951 A1 | 3/2014 | Quimby et al. | |
| 2014/0208594 A1 | 7/2014 | Scimone et al. | |
| 2014/0259686 A1 | 9/2014 | Garavaglia et al. | |
| 2014/0304993 A1 | 10/2014 | Rafii | |

FOREIGN PATENT DOCUMENTS

| | | |
|---|---|---|
| FR | 2629578 | 10/1989 |
| FR | 2634874 | 2/1990 |
| FR | 2682062 | 4/1993 |

* cited by examiner

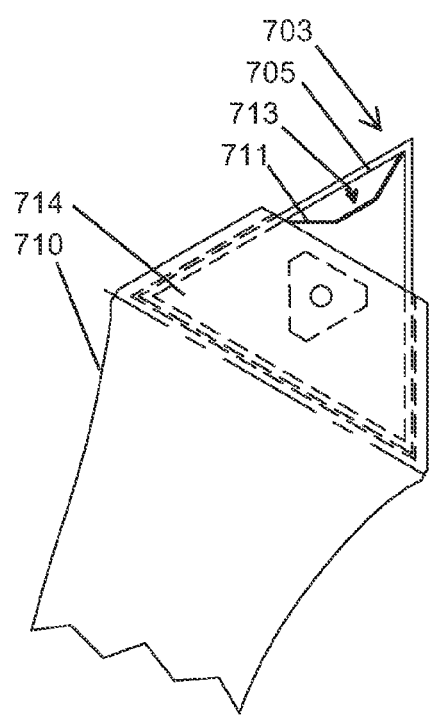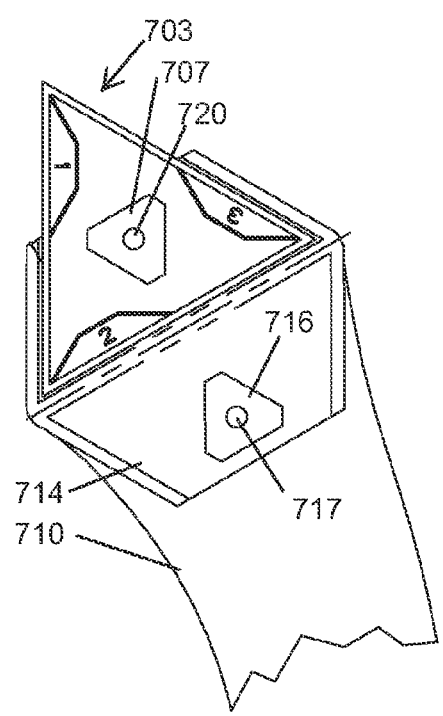
FIG. 26A
FIG. 26B

UTILITY KNIFE BLADES HAVING MULTIPLE CUTTING PORTIONS AND SECURING CONNECTIONS

CROSS-REFERENCES TO RELATED APPLICATIONS

This application is a continuation-in-part of and claims priority in U.S. patent application Ser. No. 14/018,113, filed Sep. 4, 2013, which claims priority in U.S. Provisional Patent Application No. 61/743,426, filed on Sep. 4, 2012, and which is a continuation-in-part of and claims priority in U.S. patent application Ser. No. 13/199,206, filed Aug. 23, 2011, which claims priority in U.S. Provisional Patent Application No. 61/402,536, filed Sep. 1, 2010, all of which are incorporated herein by reference.

BACKGROUND OF THE INVENTION

1. Field of the Invention

This application relates to utility knife blades, and more particularly, to unconventional utility knife blades with multiple defined individual cutting portions that allow the user to have available on one blade, multiple individual cutting portions that will be used with special designed utility knives.

2. Background and Description of the Related Art

Conventional disposable utility blades are well known in the art. These blades, along with their knives, have many industrial as well as home uses, such as for opening boxes, cutting cord or cutting wallboard. Typical utility blades are encased in a plastic or metal handle in either a fixed or retractable position. When in use, the blade is positioned to extend outwardly from the handle, exposing the cutting portion and one of the cutting points of the blade.

Utility knife blades come in a variety of shapes depending upon the intended use. A conventional utility blade has a generally trapezoidal shape that includes a back edge, a cutting edge and two side edges. The trapezoidal shaped blades have two cutting edges or tips formed at the intersections between the side edges and the cutting edge. These sharp points or tips enable a user to puncture through a material which is desired to be cut, such as sealing tape or a cardboard box. Once the object has been punctured and penetrated, the user can slice open the material by dragging the knife along the surface of the material allowing the cutting edge to cut through the material.

Existing prior art includes U.S. Pat. Nos.: 7,921,568; 5,557,852; 2,542,582; 4,592,113; 3,037,342; 5,636,845; and 4,745,653.

Although trapezoidal-shaped utility blades are widely used, they have only two usable cutting portions. They have the disadvantage that when the two portions get dull, the blade has to be replaced. The two-portioned blade, therefore, requires more frequent replacement after the two cutting portions are worn out.

Break-off style blades with a multitude of cutting portions are not well suited for many applications and there is a greater safety or injury risk due to potential snap-off during usage when side loads are applied.

There is a need for an improved utility knife blade that overcomes one or more of the above-described drawbacks and/or disadvantages of conventional prior art utility knife blades.

SUMMARY OF THE INVENTION

The present invention provides a utility knife employing a blade having multiple cutting portions, and a means for quickly and simply swapping out one cutting portion for another.

In a preferred embodiment, a six-cutting portion featured blade is employed. Each point of the generally triangular-shaped, multiple-cutting portion featured blade features two distinct cutting portions, for a total of six cutting portions located on a single blade. The blade can be rotated about a central axis to expose new cutting portions as old portions wear and dull.

One embodiment of the present invention features a knife handle capable of holding a blade with multiple cutting portions, such that the blade can be turned or flipped to present a new cutting portion when the previous cutting portion has become dull.

Another embodiment features a hinged flap which bolts against the handle, thereby making it even simpler to install, flip, or exchange blades.

Another embodiment features a hinged flap and also a number of support pegs which provide additional support for the blade and may be used in situations where higher pressure is applied to the blade during the cutting process. The pegs may be removable or permanently attached to the handle.

The blades feature several different aspects, including curved or straight cutting portions, hooked cutting portions, and a plurality of connecting features for connecting the blades to a handle in such a way as to ensure the blade is secure and provides the best cutting performance.

Other aspects and advantages of the present invention will become more readily apparent in view of the following detailed description and accompanying drawings.

BRIEF DESCRIPTION OF THE DRAWINGS

FIG. 26A is a rear elevational view of another knife handle containing another embodiment of the present invention.

FIG. 26B is a front elevational view thereof, showing the hinged panel in an open position.

DETAILED DESCRIPTION OF THE PREFERRED EMBODIMENTS

I. Introduction and Environment

As required, detailed aspects of the disclosed subject matter are disclosed herein; however, it is to be understood that the disclosed aspects are merely exemplary of the invention, which may be embodied in various forms. Therefore, specific structural and functional details disclosed herein are not to be interpreted as limiting, but merely as a basis for the claims and as a representative basis for teaching one skilled in the art how to variously employ the present invention in virtually any appropriately detailed structure.

Certain terminology will be used in the following description for convenience in reference only and will not be limiting. For example, up, base, front, back, right and left refer to the invention as oriented in the view being referred to. The words "inwardly" and "outwardly" refer to directions toward and away from, respectively, the geometric center of the embodiment being described and designated parts thereof. Forwardly and rearwardly are generally in reference to the direction of travel, if appropriate. Said terminology will include the words specifically mentioned, derivatives thereof and words of similar meaning A preferred embodiment features a generally planar blade featuring three distinct points, each point featuring at least one cutting portion. The blade is designed to be rotated amongst the cutting portions as the portions wear down from use.

II. Preferred Embodiment Knife Blade 3

Figure 1A:
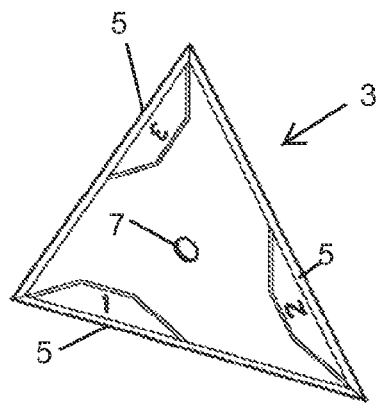
FIG. 1A is an isometric view of a three-sided blade.
Figure 1B:
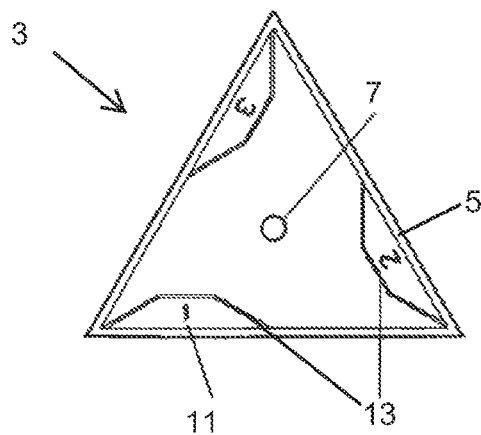
FIG. 1B is a front elevational view thereof.
Figure 1C:
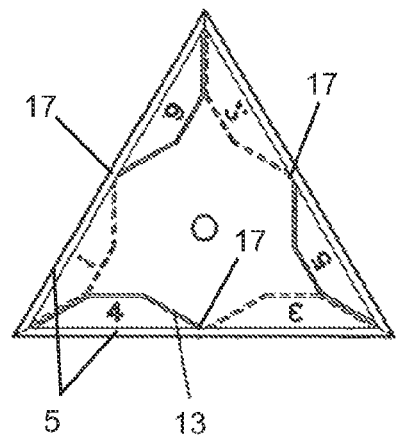
FIG. 1C is a rear elevational view thereof, showing the blade portions located on the front face in hidden lines.
Figure 2A:
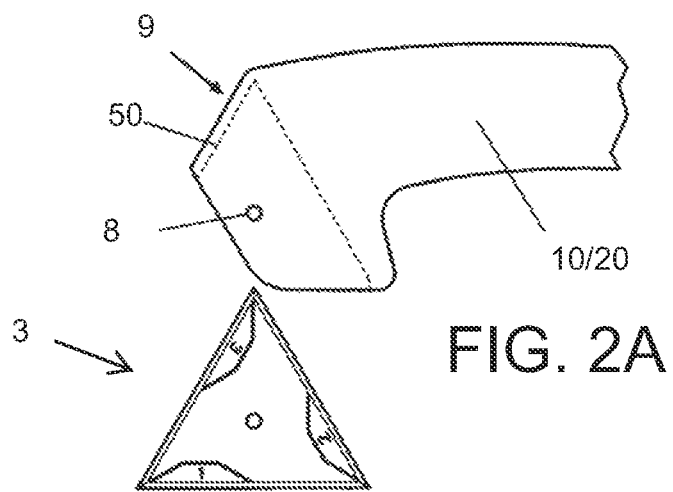
FIG. 2A is a side elevational view of a three-sided blade being fitted into a simplified knife handle and blade receiver head.
Figure 2B:
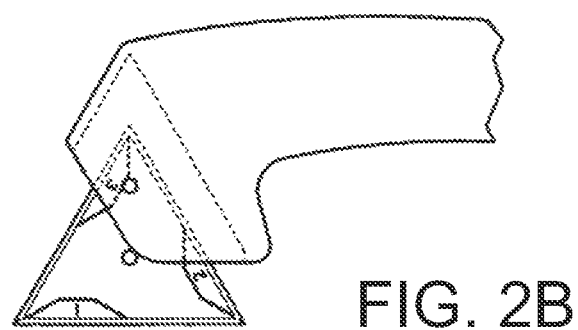
FIG. 2B is a second step in a series thereof.
Figure 2C:
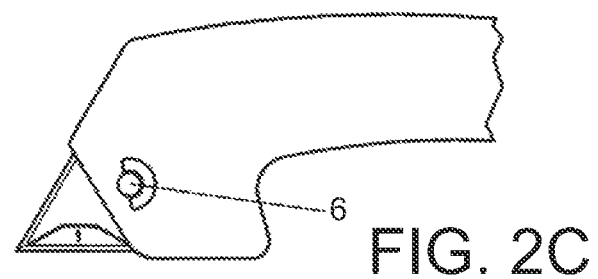
FIG. 2C is a third step in a series thereof.
Figure 2D:
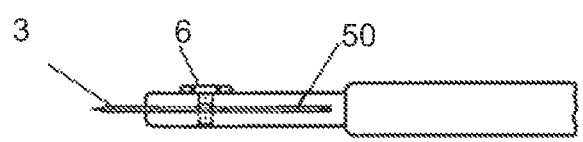
FIG. 2D is a top plan view thereof.

Figs. 1A-C show a typical three-sided knife blade 3 having six cutting portions 5. Each portion can, in turn, be presented from a knife handle (see FIGS. 2A-D) by flipping or turning the blade within the blade retaining head of the handle. The handle in the preferred embodiment would include a right portion 10 and a left portion 20 which join together to form the handle with a head portion 9 having a blade receiver gap 50. Each cutting portion is labeled by an portion label 11. A blade cutting portion indicator 13 distinguishes the cutting portion from the body of the blade. FIG. 1C shows the gap 17 located between two separate cutting portions 5. The gap can be a flat space, a notch, or it could be a continuous cutting portion. The purpose of the gap 17 is to designate between two separate cutting portions.

FIGS. 2A-D show how a blade 3 would be inserted into a blade receiver slot 50 within the receiving head 9 of a knife handle having a right half 10 and a left half 20. A handle mounting hole 8 located in the handle is aligned with the central mounting hole 7 of the blade 3, and a mounting bolt 6 secures the blade within the handle.

III. First Alternative Embodiment Knife Blade 53

Figure 3A:
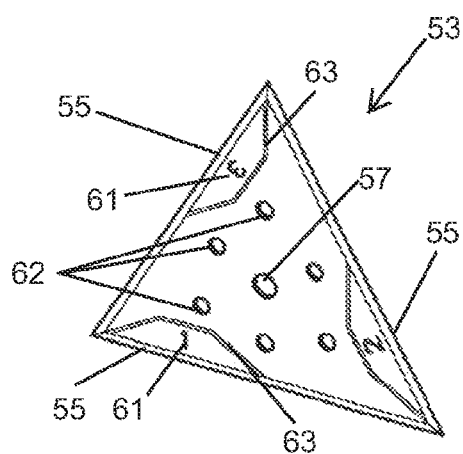
FIG. 3A is an isometric view of a three-sided blade of an alternative configuration.
Figure 3B:
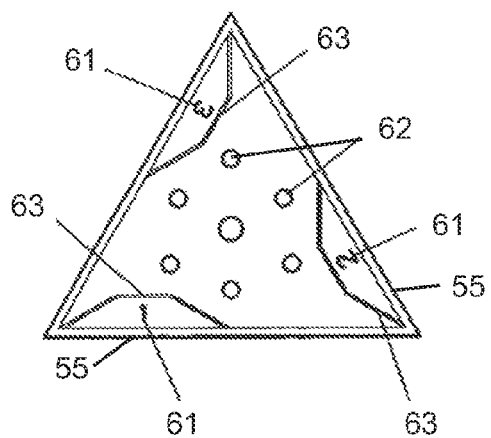
FIG. 3B is a front elevational view thereof.
Figure 3C:
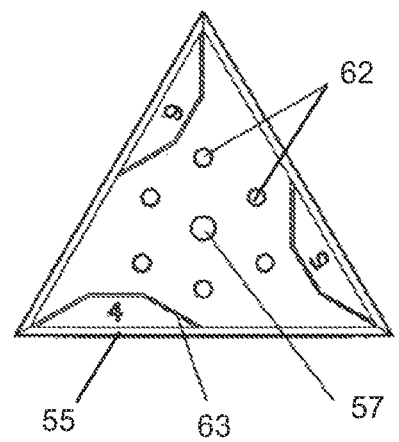
FIG. 3C is a rear elevational view thereof.

FIGS. 3A-C show an alternative arrangement of the three-sided blade which includes a secondary ring of mounting holes 62 which provides additional stability to a blade secured by those holes in addition to the blade retaining hole 57. Here also, the cutting portion 55, cutting portion indicator 63 and cutting portion identifier 61 may be used.

III. Second Alternative Embodiment Knife Blade 103

Figure 4A:
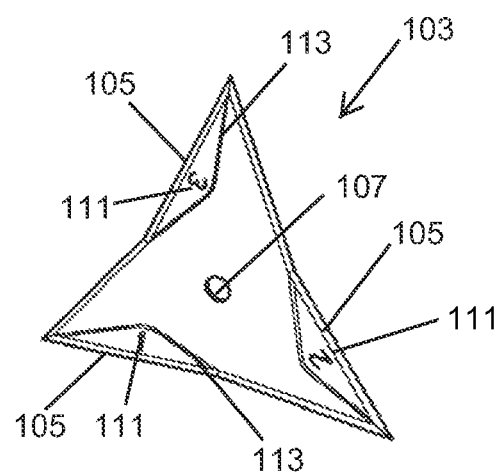
FIG. 4A is an isometric view of a three-sided blade of an alternative configuration.
Figure 4B:
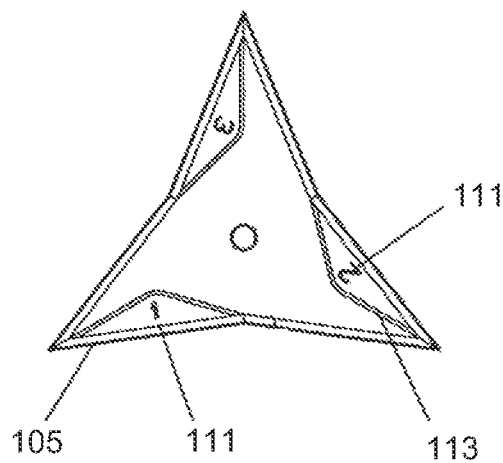
FIG. 4B is a front elevational view thereof.
Figure 4C:
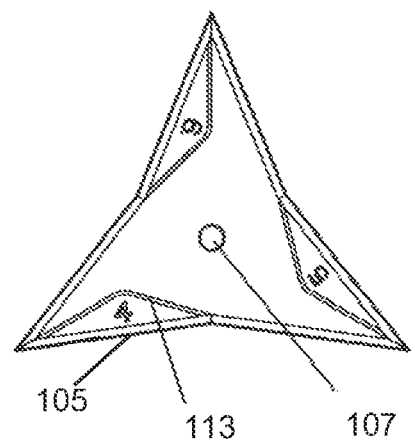
FIG. 4C is a rear elevational view thereof.
Figure 5A:
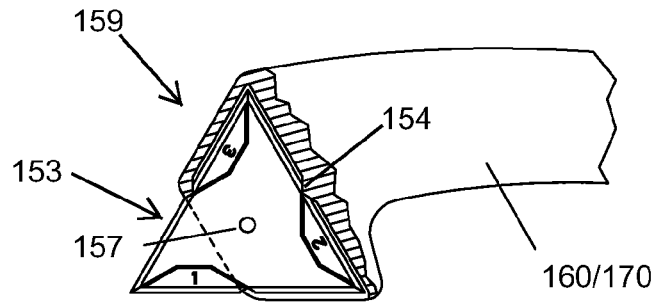
FIG. 5A is a side elevational view of a three-sided blade with notched receivers being fitted into a simplified knife handle and blade receiver head, the view including a cut-away view of the blade being contained within the handle.
Figure 5B:
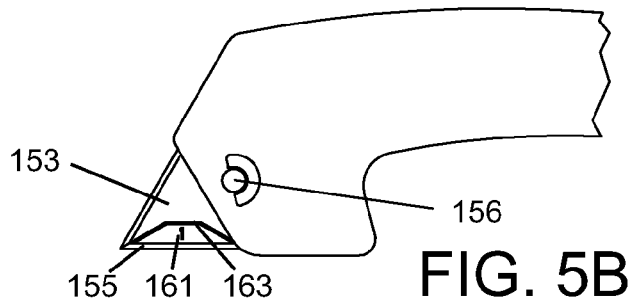
FIG. 5B is a side elevational view thereof, showing the external face of the handle.
Figure 5C:
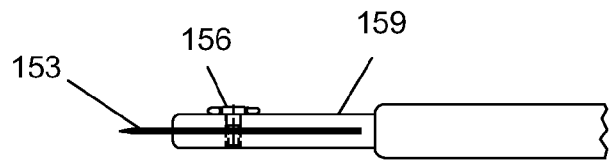
FIG. 5C is a top plan view thereof.
Figure 5D:
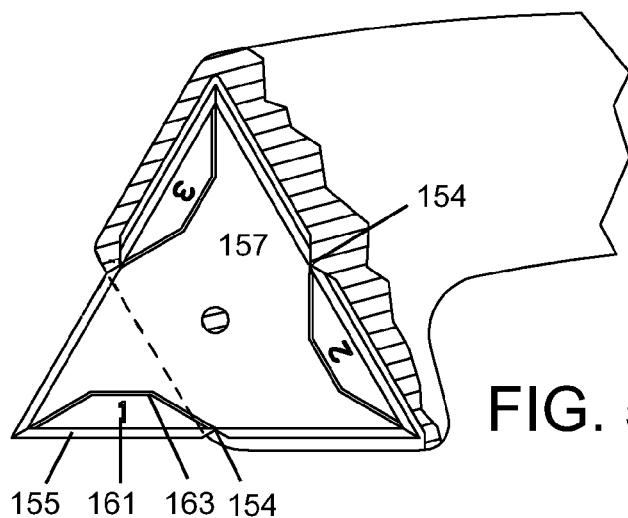
FIG. 5D is sectional view thereof, showing the blade being received by the handle in more detail.

As shown in FIGS. 4A-4C, an alternative embodiment three-tipped blade 103 includes six cutting portions 105 each labeled with a cutting portion identifier 111 and defined by a cutting portion indicator 113. A centralized mounting hole 107 is used for mounting this blade 103 into a handle. This blade features angled portions, forming a 6-sided planar blade.

V. Third Alternative Embodiment Knife Blade 153

As shown in FIGS. 5A-5D, an alternative embodiment three-tipped blade 153 includes six cutting portions 155 each labeled with a cutting portion identifier 161 and defined by a cutting portion indicator 163. A blade notch 154 is located between the two cutting portions 155 defining each side of the blade 153. This notch provides greater stability and secures the blade 153 within the mounting head 159 of the handle comprising a right half 160 and a left half 170. A mounting pin 156 secures the blade 153 to the mounting head 159 via the central mounting hole 157.

The blade notches relieve pressure on the cutting blade 153 when the blade is actively cutting an object. This prevents the cutting portion of the blade from being pressed against the interior of the utility knife receiving head, which can cause inactive cutting portions to become dulled. The receiving head of the utility knife handle includes notched posts which receive the blade notches 154. These notches also assist in manufacturing purposes, indexing, and assuring that the blade is properly located within the knife handle.

VI. Fourth Alternative Embodiment Knife Blade 203

Figure 6A:
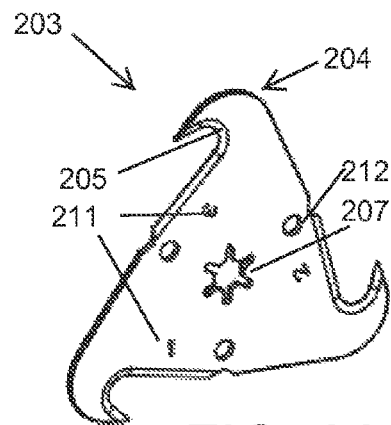
FIG. 6A is an isometric view of a three-sided blade of an alternative configuration including hooked blade-ends.
Figure 6B:
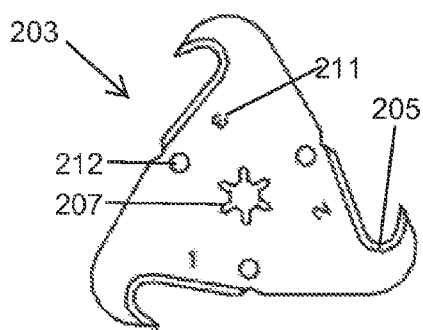
FIG. 6B is a front elevational view thereof.
Figure 6C:
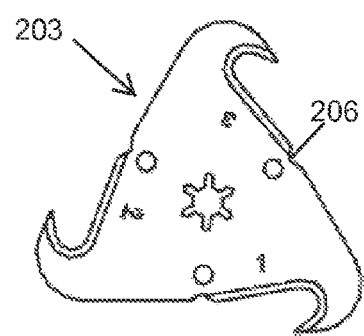
FIG. 6C is a rear elevational view thereof.

FIGS. 6A-6C show another embodiment of a knife blade 203 having a generally planar shape and featuring three hooked tips 204 each having a cutting portion 205 located along the inside of the hook feature. Each cutting portion is identified by a cutting portion identifier 211. Blade notches 206 help to secure the blade to a blade handle (not shown). A central mounting hole 207 features multiple radiating arms which help to lock the blade in place when mounted within a blade handle. Additional mounting holes 212 are located around the central mounting hole 207 to receive mounting pegs or other securing elements when the blade is inserted into a handle.

Figure 14:
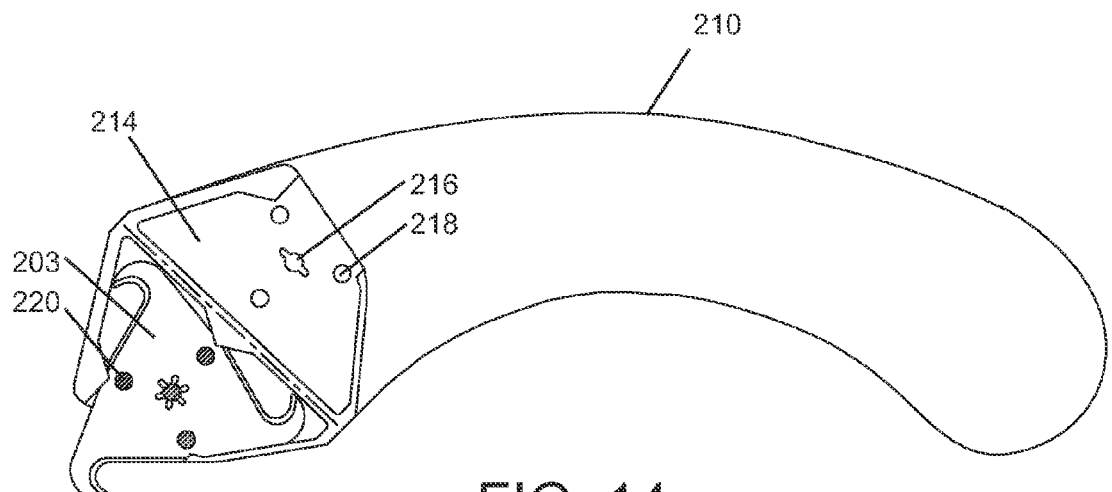
FIG. 14 is a side elevational view of a handle receiving the blade shown in FIGS. 6A-6C.

FIG. 14 shows a handle 210 receiving the blade 203. Three pegs 220 are inserted through the secondary mounting holes 212. A panel 214 closes over the blade 203 once it is inserted into the handle. The panel has peg receivers 218 and a central locking element receiver 216 which secure the blade between the panel and the handle 210.

The mounting pegs relieve pressure on the cutting blade 203 when the blade is actively cutting an object. This prevents the cutting portion of the blade from being pressed against the minterior of the utility knife receiving head, which can cause inactive cutting portions to become dulled. The mounting holes which are associated with the pegs also assist in manufacturing purposes, indexing, and assuring that the blade is properly located within the knife handle.

VII. Fifth Alternative Embodiment Knife Blade 253

Figure 7A:
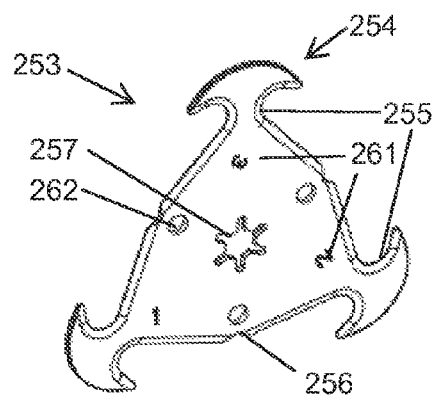
FIG. 7A is an isometric view of a three-sided blade of an alternative configuration including double-hooked blade-ends.
Figure 7B:
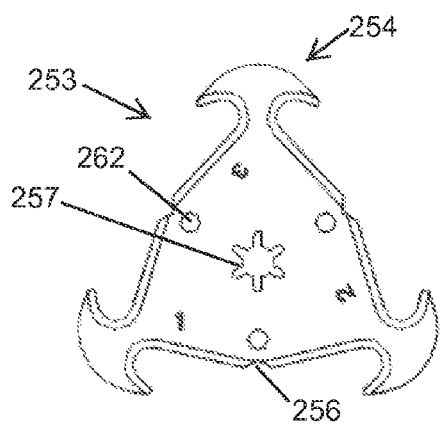
FIG. 7B is a front elevational view thereof.
Figure 7C:
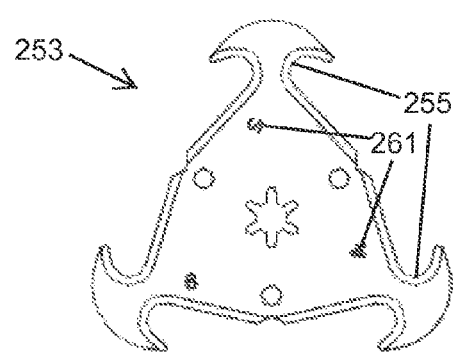
FIG. 7C is a rear elevational view thereof.

FIGS. 7A-7C show another embodiment of a knife blade 253 having a generally planar shape and featuring three double-hooked tips 254 each having two cutting portions 255 located along the inside of the hook feature. Each cutting portion is identified by a cutting portion identifier 261. Blade notches 256 help to secure the blade to a blade handle (not shown). A central mounting hole 257 features multiple radiating arms which help to lock the blade in place when mounted within a blade handle. Additional mounting holes 262 are located around the central mounting hole 257 to receive mounting pegs or other securing elements when the blade is inserted into a handle.

Figure 15:
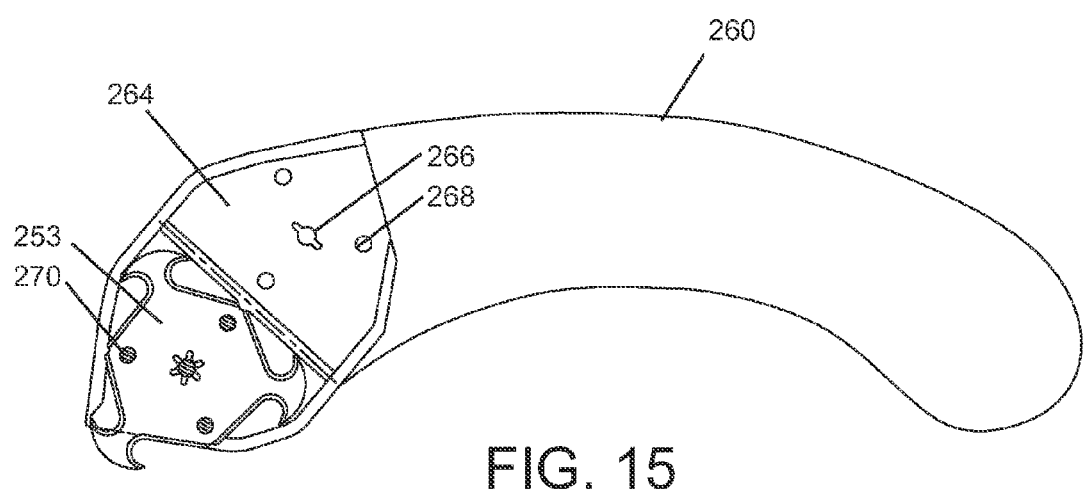
FIG. 15 is a side elevational view of a handle receiving the blade shown in FIGS. 7A-7C.

FIG. 15 shows a handle 260 receiving the blade 203. Three pegs 270 are inserted through the secondary mounting holes 262. A panel 264 closes over the blade 253 once it is inserted into the handle. The panel has peg receivers 268 and a central locking element receiver 266 which secure the blade between the panel and the handle 260.

VIII. Sixth Alternative Embodiment Knife Blade 303

Figure 8A:
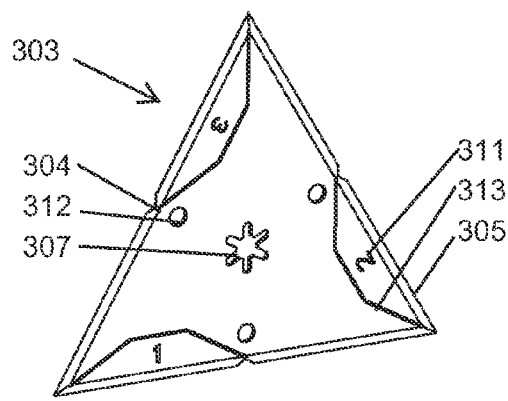
FIG. 8A is an isometric view of a three-sided blade of an alternative configuration including notched receivers located between cutting portions which would be received by a handle as shown in FIGS. 5A-5D.
Figure 8B:
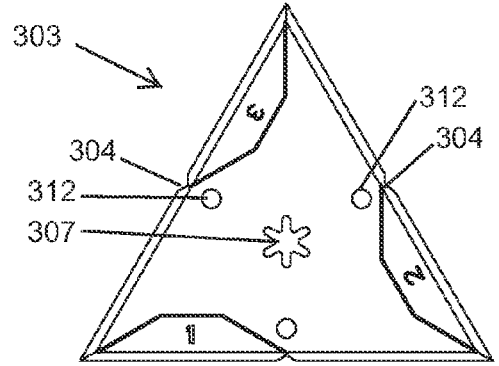
FIG. 8B is a front elevational view thereof.
Figure 8C:
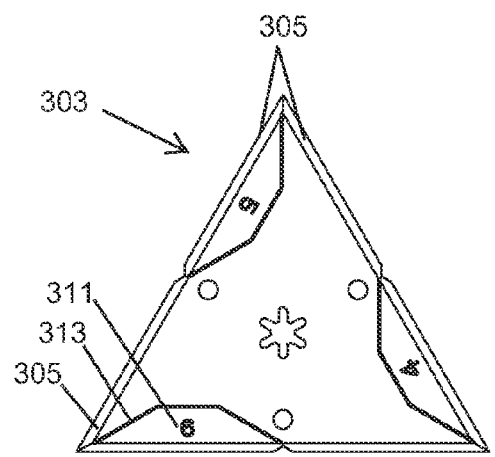
FIG. 8C is a rear elevational view thereof.

FIGS. 8A-8C show another embodiment of a knife blade 303 having a generally planar shape and featuring three tips each having two cutting portions 305. Each cutting portion is identified by a cutting portion identifier 311 and a cutting portion indicator 313. Blade notches 304 help to secure the blade to a blade handle (not shown). A central mounting hole 307 features multiple radiating arms or spokes which help to lock the blade in place when mounted within a blade handle. Additional mounting holes 312 are located around the central mounting hole 307 to receive mounting pegs or other securing elements when the blade is inserted into a handle

IX. Seventh Alternative Embodiment Knife Blade 353

Figure 9A:
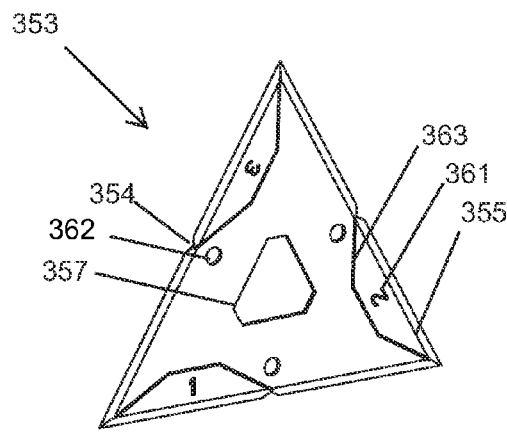
FIG. 9A is an isometric view of a three-sided blade of an alternative configuration including notched receivers located between cutting portions and an alternative mounting hole located centrally within the blade.
Figure 9B:
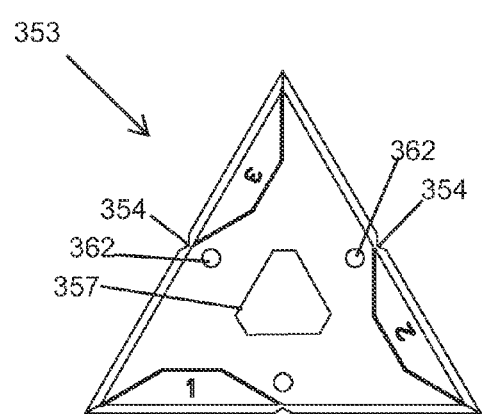
FIG. 9B is a front elevational view thereof.
Figure 9C:
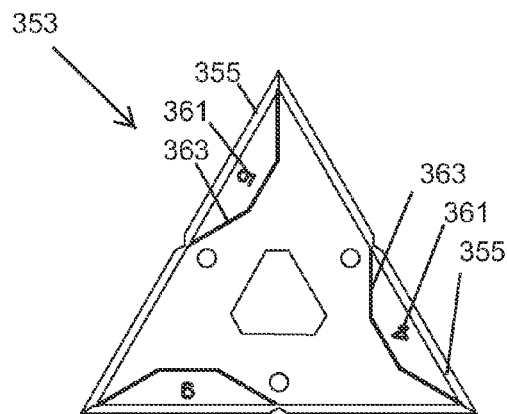
FIG. 9C is a rear elevational view thereof.

FIGS. 9A-9C show another embodiment of a knife blade 353 having a generally planar shape and featuring three tips each having two cutting portions 355. Each cutting portion is identified by a cutting portion identifier 361 and a cutting portion indicator 363. Blade notches 354 help to secure the blade to a blade handle (not shown). A central mounting hole 357 features a large geometric opening having three long sides and three short sides to lock the blade in place when mounted within a blade handle. Additional mounting holes 362 are located around the central mounting hole 357 to receive mounting pegs or other securing elements when the blade is inserted into a handle.

X. Eighth Alternative Embodiment Knife Blade 403

FIGS. 10A-10D show another embodiment of a knife blade 403 having a generally planar shape and featuring three tips each having two cutting portions 405. Each cutting portion is identified by a cutting portion identifier 411 and a cutting portion indicator 413. Blade notches 404 help to secure the blade to a blade handle (not shown). A central mounting hole 407 and secondary mounting holes 412 receive mounting pegs or other securing elements when the blade is inserted into a handle. A grip surface 416 including a hole 417 is located in proximity to each of the three points of the cutting blade 403. The grip surface enhances the ability to grasp the blade for replacement or when turning the blade to use a new cutting portion.

Figure 10A:
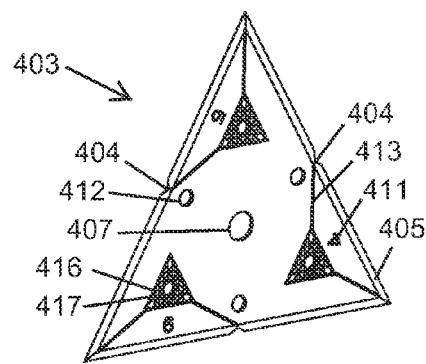
FIG. 10A is an isometric view of a three-sided blade of an alternative configuration including notched receivers located between cutting portions and etched gripping surfaces located at various locations on the face of the blade.
Figure 10B:
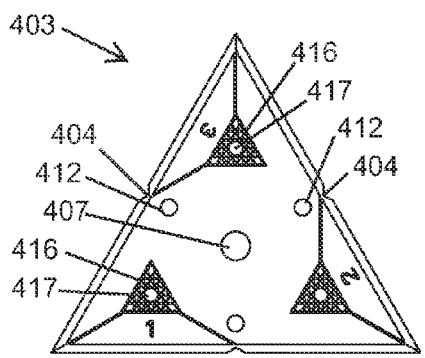
FIG. 10B is a front elevational view thereof.
Figure 10C:
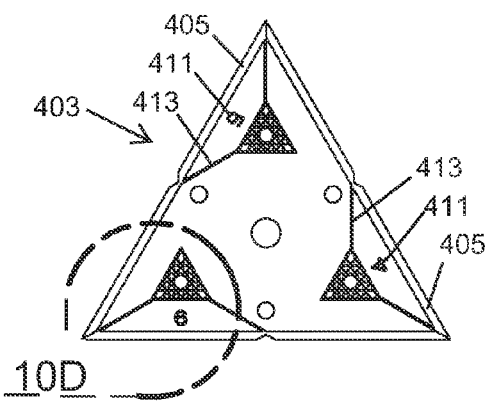
FIG. 10C is a rear elevational view thereof.
Figure 10D:
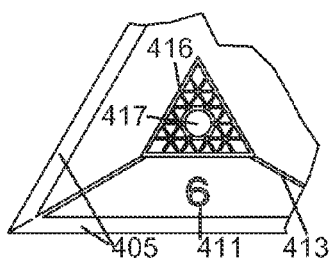
FIG. 10D is a more detailed view taken about the circle in FIG. 10C.
Figure 10E:
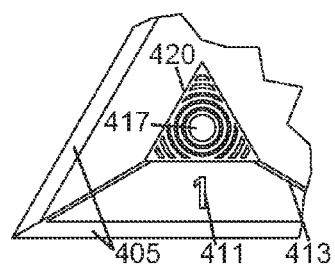
FIG. 10E shows a blade featuring an alternative etching pattern from that shown in FIGS. 10A-10D.

FIG. 10E shows a slightly altered version wherein the pattern of the grip surface 420 is based upon concentric rings instead of the pattern shown in FIGS. 10A-10D.

XI. Ninth Alternative Embodiment Knife Blade 453

Figure 11A:
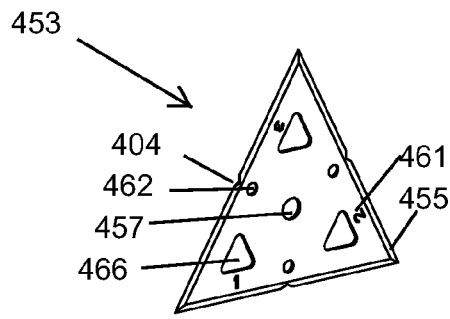
FIG. 11A is an isometric view of a three-sided blade of an alternative configuration including mass-reducing cut-outs.
Figure 11B:
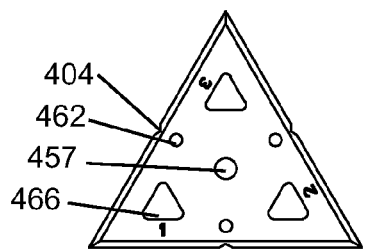
FIG. 11B is a front elevational view thereof.
Figure 11C:
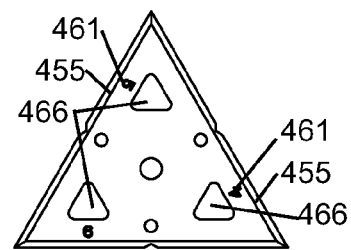
FIG. 11C is a rear elevational view thereof.
Figure 11D:
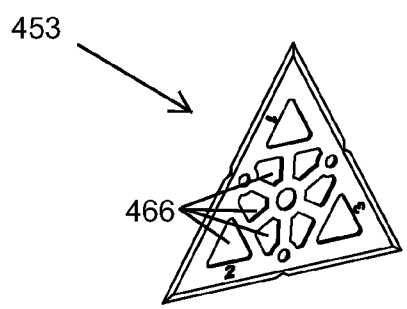
FIG. 11D is an isometric view of an alternative orientation thereof, featuring additional mass-reducing cut-outs.
Figure 11E:
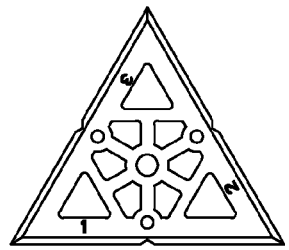
FIG. 11E is a front elevational view thereof.
Figure 11F:
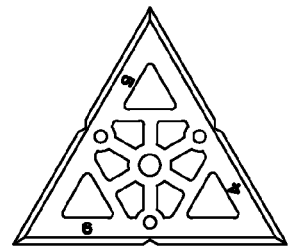
FIG. 11F is a rear elevational view thereof.
Figure 12A:
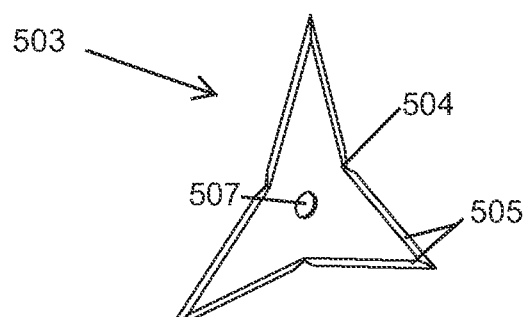
FIG. 12A is an isometric view of an alternative embodiment multi-edged blade including multiple cutting portions.
Figure 12B:
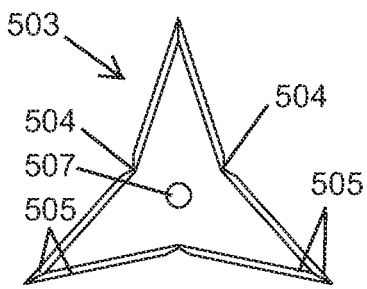
FIG. 12B is a front elevational view thereof.
Figure 12C:
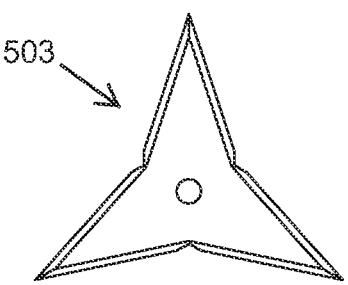
FIG. 12C is a rear elevational view thereof.

FIGS. 11A-11C show another embodiment of a knife blade 453 having a generally planar shape and featuring three tips each having two cutting portions 455. Each cutting portion is identified by a cutting portion identifier 461. Blade notches 454 help to secure the blade to a blade handle (not shown). A central mounting hole 457 and secondary mounting holes 462 receive mounting pegs or other securing elements when the blade is inserted into a handle. A number of mass-reducing cutouts 466 are punched through, cut out, or otherwise removed from the body of the blade 453. An example pattern is shown in FIGS. 11A-11C and an alternative pattern is shown in FIGS. 11D-11F featuring additional mass-reducing cutouts 466; however, any pattern, shape, or variation of mass-reducing cutouts could be used to reduce the weight of the blade 453. The purpose of the mass-reducing elements is to reduce friction while cutting using the blade.

XII. Tenth Alternative Embodiment Knife Blade 503

FIGS. 12A-12DC show another embodiment of a knife blade 503 having a generally planar shape and featuring three tips each having two cutting portions 505. Blade notches 504 help to secure the blade to a blade handle (not shown). A central mounting hole 507 for mounting the blade to a handle (not shown) is centrally located in the blade 503.

XIII. Eleventh Alternative Embodiment Knife Blade 553

Figure 13A:
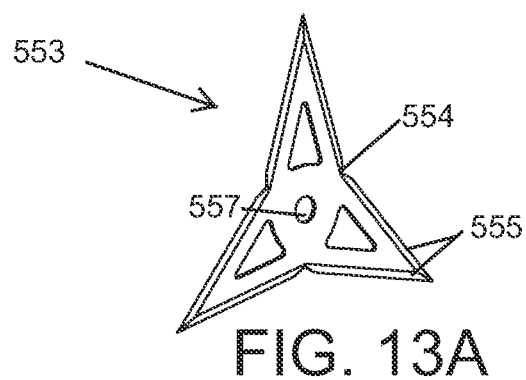
FIG. 13A is an isometric view of an alternative embodiment multi-edged blade including multiple cutting portions and mass-reducing spaces.
Figure 13B:
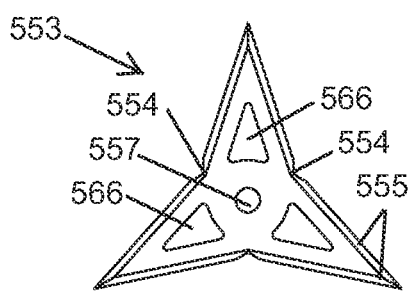
FIG. 13B is a front elevational view thereof.
Figure 13C:
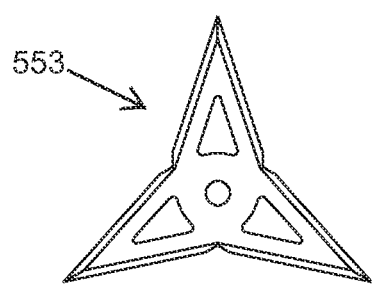
FIG. 13C is a rear elevational view thereof.

FIGS. 13A-13C show a slightly altered embodiment of a knife blade 553 having a generally planar shape and featuring three tips each having two cutting portions 555. Blade notches 554 help to secure the blade to a blade handle (not shown). A central mounting hole 557 for mounting the blade to a handle (not shown) is centrally located in the blade 553. Mass-reducing cutouts 566 are shown removed symmetrically from each point of the blade 553, but the cutouts could be any shape and located anywhere on the blade's surface.

XIV. Additional Alternative Embodiment Knife Blades 603

Figure 23:
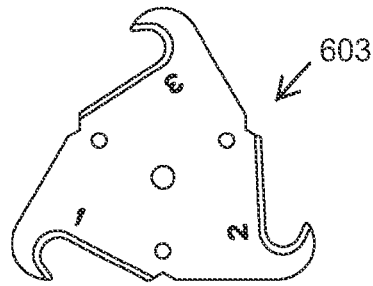
FIG. 23 is an elevational view of yet another alternative blade.

FIGS. 16-23 present additional knife blade 603 variations to those blades described in detail above. Each includes blade cutting portion identifiers, many (FIGS. 16-21) include cutting portion indicators, and all present three or six cutting portions. FIG. 23 shows a knife blade 603 featuring a blade notch.

Figure 16:
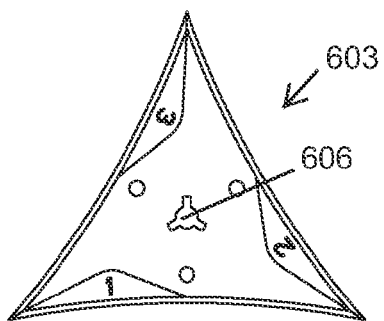
FIG. 16 is an elevational view of an alternative blade.
Figure 17:
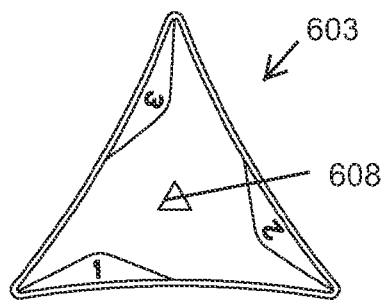
FIG. 17 is an elevational view of another alternative blade.
Figure 18:
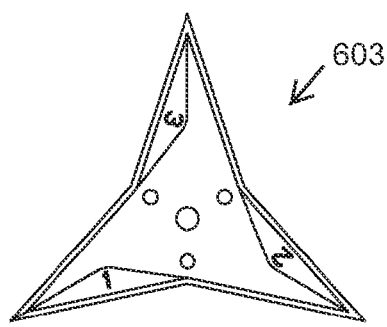
FIG. 18 is an elevational view of yet another alternative blade.
Figure 19:
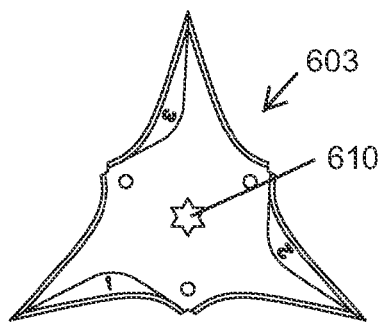
FIG. 19 is an elevational view of yet another alternative blade.
Figure 20:
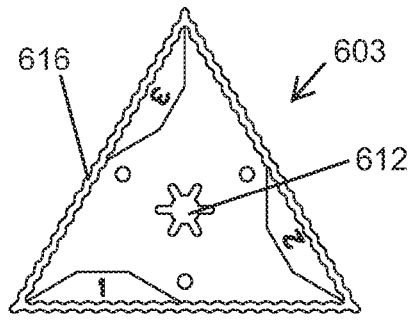
FIG. 20 is an elevational view of yet another alternative blade.
Figure 21:
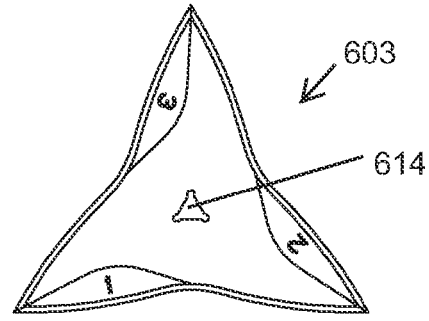
FIG. 21 is an elevational view of yet another alternative blade.
Figure 22:
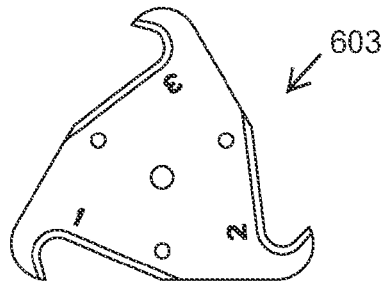
FIG. 22 is an elevational view of yet another alternative blade.

FIG. 16 presents a knife blade 603 having a 3-spoke center mounting hole 606. FIG. 17 presents a knife blade 603 having a triangular shaped center mounting hole 608. FIG. 19 presents a knife blade 603 having a six-pointed star shaped center mounting hole 610. FIG. 20 presents a knife blade 603 having scalloped cutting portions 616 and a six-spoked center mounting hole 612. FIG. 21 presents a knife blade 603 having a triangular-shaped center mounting hole 614 with rounded points.

Any variation of a three-pointed blade, from the general shape, placement of cutting portions, location and/or shape of mounting holes, and type of cutting portion surface, could be possible in an embodiment of the present invention.

XV. Alternative Embodiment Knife Blade 653 and Knife Handle 660 Assembly

Figure 24A:
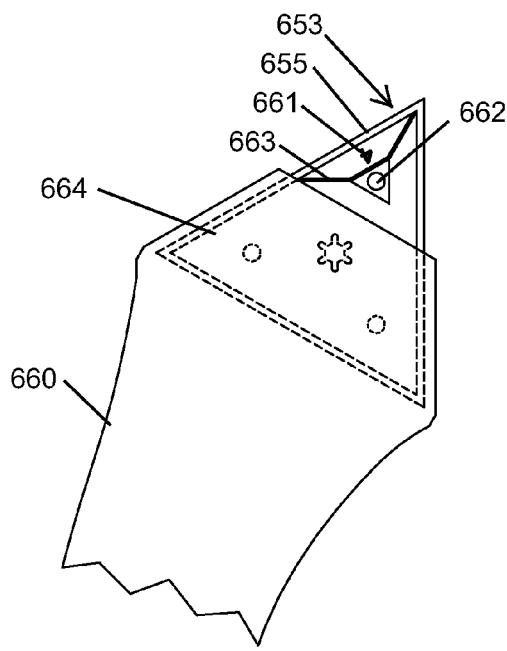
FIG. 24A is a rear elevational view of a knife handle containing an embodiment of the present invention.
Figure 24B:
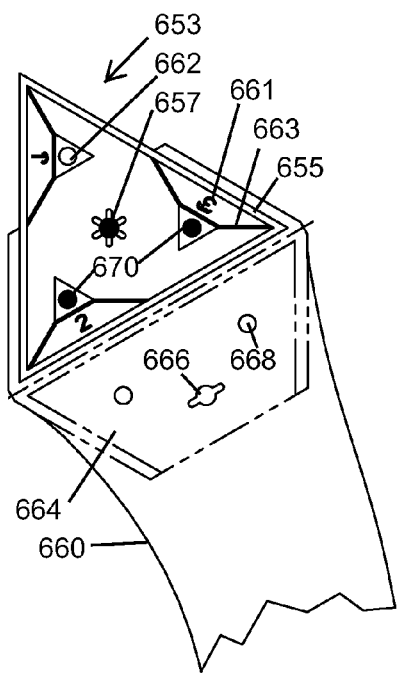
FIG. 24B is a front elevational view thereof, showing the hinged panel in an open position.

FIGS. 24A-24B show a handle 660 including a hinged panel 664 receiving another embodiment of a three-pointed knife blade 653 of generally planar shape. The blade 653 includes six cutting portions 655 each having a cutting portion identifier 661 and a cutting portion 663. A central mounting hole 657 and three surrounding mounting holes 662 are used to secure the blade within the handle. The panel includes peg receiver holes 668 which receive pegs 670 passing through the secondary mounting holes 662 of the blade 653. A center mounting bolt receiver 666 is also located in the panel and is aligned with the center mounting hole 657 of the blade 653. In this orientation, the secondary mounting holes 662 closest to the two points not exposed from the handle are engaged with pegs 670, and the third secondary mounting hole associated with the point of the blade exposed from the handle is not engaged with a peg.

Figure 25A:
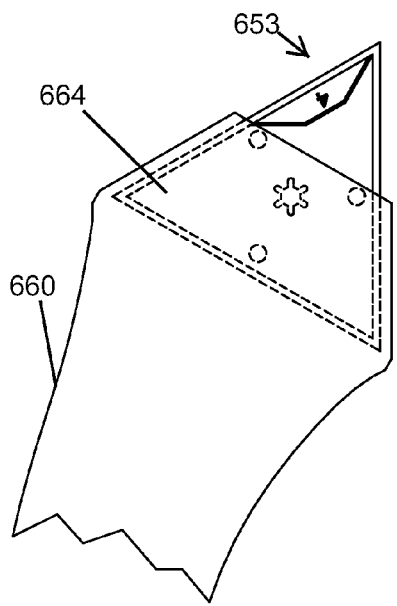
FIG. 25A is a rear elevational view of another knife handle containing another slightly-altered embodiment of the present invention.
Figure 25B:
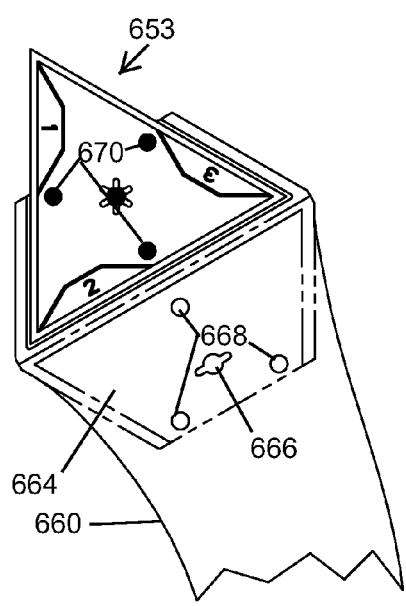
FIG. 25B is a front elevational view thereof, showing the hinged panel in an open position.

FIGS. 25A-25B show a slightly altered embodiment of the same knife blade 653 wherein the secondary mounting holes 662 are oriented such that all three are engaged with pegs 670 whenever the panel 664 is closed over the blade 653.

XVI. Alternative Embodiment Knife Blade 703 and Knife Handle 710 Assembly

FIGS. 26A-26B show a handle 710 including a hinged panel 714 receiving another embodiment of a three-pointed knife blade 703 of generally planar shape. The blade 703 includes six cutting portions 705 each having a cutting portion identifier 711 and a cutting edge portion 713. A central mounting hole 707 is used to secure the blade within the handle. The central mounting hole is of an abnormal shape featuring three short sides interspaced amongst three long sides which matches a similarly-shaped peg located on the handle. The shape of the mounting hole 707 and the peg does not matter, as long as it allows for the blade 703 to be rotated amongst the cutting portions and secures the blade from rotating when the peg is placed through the mounting hole. A mounting bolt receiver 720 is located in the center of the peg. The panel 714 includes a peg receiver 716 and a mounting bolt receiver hole 717.

XVII. Alternative Embodiment Knife Blade 753 Featuring a Wear Coat Layer 768

Figure 27A:
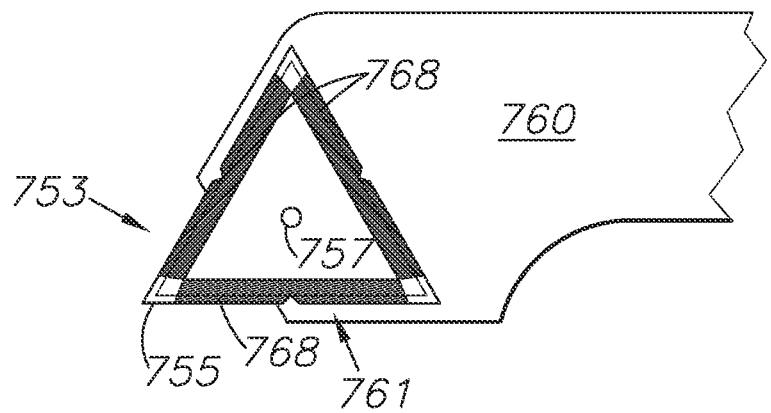
FIG. 27A is an elevational view showing an embodiment of the present invention which includes a wear coat shown in original condition.
Figure 27B:
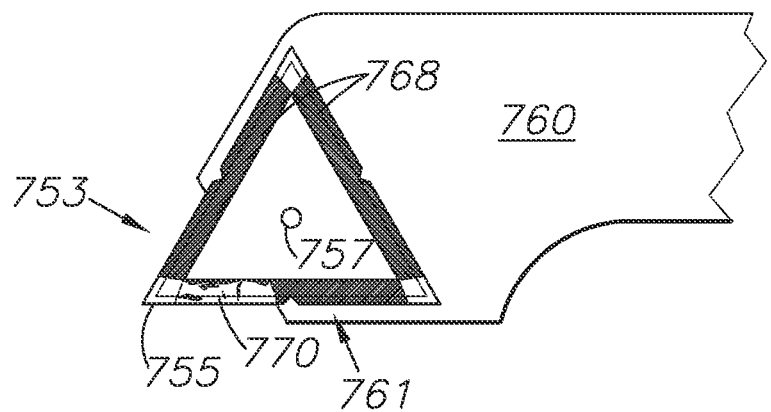
FIG. 27B is an elevational view thereof showing the wear coat in a worn condition signifying that the blade should be rotated.

FIGS. 27A-27B show a handle 760 including a blade receiver head 761 receiving another embodiment of a three-pointed knife blade 753 of generally planar shape. The blade 753 includes three or six cutting portions 755. A central mounting hole 757 is used to secure the blade within the handle.

The wear coat 768, possibly of an ink-like substance or other semi-permanent marking agent, may cover any or all portions of the blade 753. This would include the cutting portions 755 and any portion of the blades that would come in contact with the already cut material. The wear coat may be designed in any configuration, such as a circle, square or others. The wear-coat may consist of a Logo or company name, or may include cutting portion indicators in the forms of letters or numbers.

The wear-coat will allow the user the ability to distinguish between the used and the unused cutting surfaces 755 of the blade 753. As the blade is cutting through material, only that portion of the blade's wear-coat will sustain and visually show wear. Once the wear coat has been worn significantly away to a clean, smooth surface 770, it will be an indication to the user that the cutting portion should be swapped for a new cutting portion. Of course the user will make the ultimate determination based upon the dullness of the blade. Unused cutting portions on the blade will be immediately recognizable by the un-worn finish of the wear coat along those particular portions.

In some embodiments, the wear coat could double as a lubricant which would reduce the friction of the knife blade against the cutting surface. This could be particularly useful in certain fields of industry. The wear coat indicates both when the blade is likely becoming dull and when the lubricant is running low.

XVIII. Alternative Embodiment Knife Blade 803 Featuring a Wear Coat 818

Figure 28A:
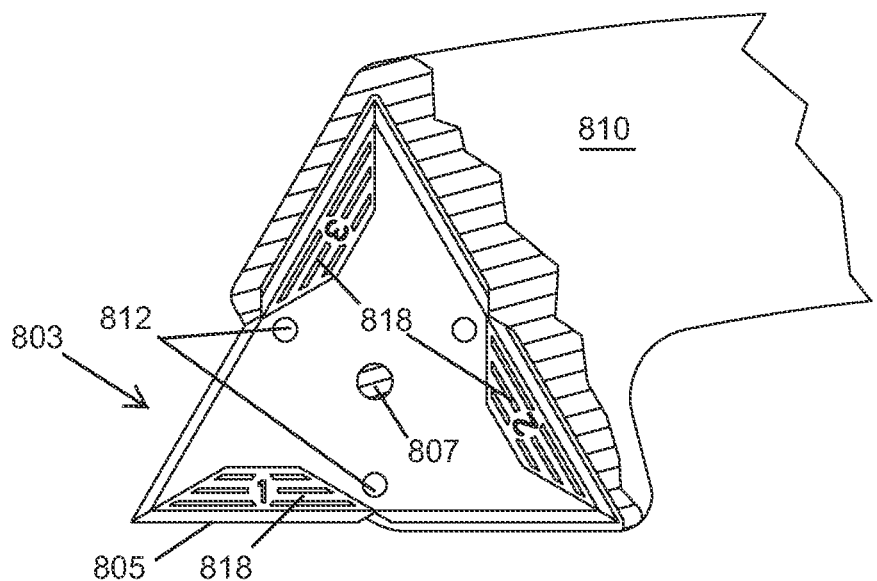
FIG. 28A is an elevational view showing an alternative embodiment of the present invention which includes a wear coat shown in original condition.
Figure 28B:
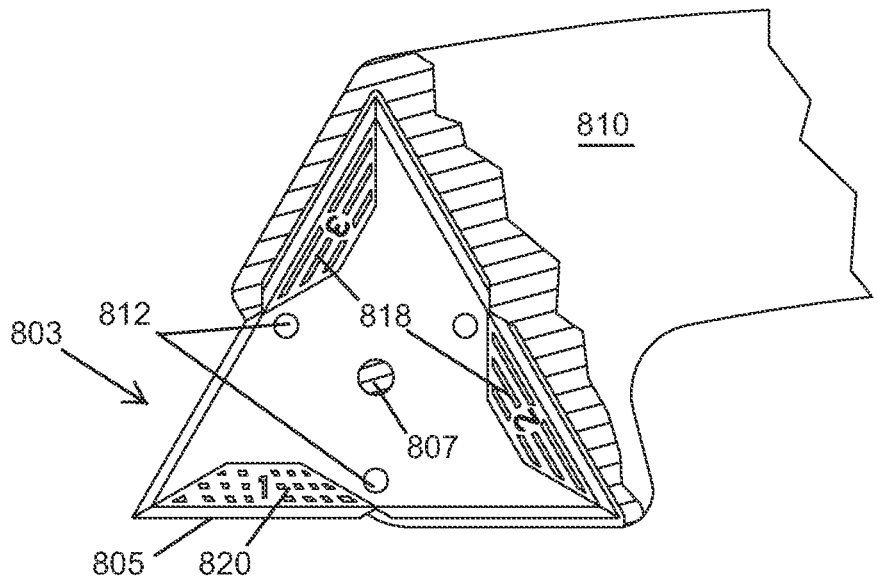
FIG. 28B is an elevational view thereof showing the wear coat in a worn condition signifying that the blade should be rotated.

FIGS. 28A-28B show an alternative method of establishing a wear coat, wherein the wear coat 818 consists of a raised or otherwise altered surface of the knife blade 803 along the cutting portion 805 of the blade. The blade 803 is mounted to a knife handle 810 via a central mounting hole 807 and multiple secondary mounting holes 812 using features disclosed elsewhere above. As the cutting portion is used, the surface area of the wear coat 818 becomes worn down and wears away to a smooth surface 820, indicating that the cutting portion is dull and should be switched.

For all of the above-mentioned embodiments, simple variations may be incorporated. For example, the blade's cutting portion can be straight, serrated, wave shaped or can have micro serration's and other shapes as needed. The blade can be of different materials such as steel alloys, bimetallic, trimetallic, and ceramics and it can have different types of coatings to enhance its surface properties, hardness and to resist corrosion. The blade can be of different sizes and thickness.

All of the blade variations introduced in this application could be made of any appropriate material, such as stainless steel. However, these blades are also suitably made of carbide, ceramic, powder metal, or other non-typical materials. This is due to the novel features as discussed, such as the mounting pegs and mounting notches which relieve pressure on the actual blade during cutting action, thereby increasing the cutting portion's durability.

It is to be understood that while certain aspects of the disclosed subject matter have been shown and described, the disclosed subject matter is not limited thereto and encompasses various other embodiments and aspects.

Having thus described the invention, What is claimed as new and desired to be secured by Letters Patent is:

1. A disposable cutting blade for use in a utility knife with a housing having a mounting bolt and a stabilizing element, the blade comprising:
    a generally planar body with three sides defining three distinct points, each of the sides including a center notch and each of the sides having a first cutting portion and a second cutting portion;
    said generally planar body including a first face, a second face, and a mounting hole at a center portion of the faces of the body to receive the mounting bolt of the knife; and
    wherein the blade is to be received in the knife housing so that the knife stabilizing element is received by one of the notches and one of the cutting portions is exposed and the blade is configured to be removed from the housing, rotated, and replaced within the housing that the stabilizing element is received in a different one of the notches and a different one of the cutting portions is exposed.

2. The cutting blade of claim 1, further comprising:
    said body including a plurality of cutting portion indicators, each said indicator located on one of said first face and said second face of said planar body, each of said indicators indicating a location of a respective one of said cutting portions; and
    a plurality of cutting portion identifiers located on one of said first face and said second face, each said identifiers is located adjacent to a respective one of said cutting portions.

3. The cutting blade of claim 2, wherein said plurality of cutting portion identifiers are selected from a list comprising: numbers, letters, and logos.

4. The cutting blade of claim 2, wherein said cutting portion indicators are generally trapezoidal in shape.

5. The cutting blade of claim 1, said body further comprising a plurality of secondary mounting holes located radially around said primary mounting hole.

6. The cutting blade of claim 1, wherein said primary mounting hole comprises a plurality of spokes connected to a generally circular central cavity, said spokes configured to receive a tooth located on said retaining bolt.

7. The cutting blade of claim 1, wherein said primary mounting hole comprises a cavity punched out of the center portion of said body, said cavity comprising three long sides interspaced by three short sides forming a total of six sides.

8. The cutting blade of claim 1, wherein at least one grip surface area is located on at least one of said first face and said second face of said body and said at least one grip surface area incorporates a grip structure defining a grip pattern.

9. The cutting blade of claim 8, wherein said at least one grip surface area is three grip surface areas, each of said three grip surface areas incorporating a grip structure defining a grip pattern, and each of three grip surface areas is located in proximity to a respective one of said three distinct points.

10. The cutting blade of claim 9, wherein each of said three grip structures is generally triangular in shape and contains a center through hole.

11. The cutting blade of claim 1, further comprising at least one mass-reducing cutout punched through the planer body of said cutting blade, said mass-reducing cutout configured to reduce cutting friction from said cutting blade when using one of said cutting portions.

12. The cutting blade of claim 1, wherein said primary mounting hole is triangular in shape.

13. The cutting blade of claim 1, wherein said primary mounting hole is shaped as a twelve-sided star.

14. The cutting blade of claim 1, wherein each of said cutting portions comprises a scalloped shape.

15. The cutting blade of claim 1, further comprising:
    a wear-coat applied to at least one of said first face and said second face of said planar body;
    said wear-coat covering generally each of said cutting portions; and
    said wear-coat configured to wear away as a respective one of said cutting portions is used.

16. The cutting blade of claim 15, wherein said wear-coat is comprised of a material selected from the list comprising: ink, paint, graphite, and raised metal bumps formed on the surface of said body.

* * * * *